United States Patent [19]

Boezen et al.

[11] Patent Number: 5,065,113
[45] Date of Patent: Nov. 12, 1991

[54] MULTIPLE-AMPLIFIER CONTROL ARRANGEMENT

[75] Inventors: Hendrik Boezen; Pieter Buitendijk; Rudolf W. Mathijssen, all of Nijmegen, Netherlands

[73] Assignee: U.S. Philips Corp., New York, N.Y.

[21] Appl. No.: 547,888

[22] Filed: Jul. 2, 1990

[30] Foreign Application Priority Data

Jul. 6, 1989 [NL] Netherlands ............................ 8901725

[51] Int. Cl.$^5$ .............................................. H03E 3/45
[52] U.S. Cl. ...................................... 330/260; 330/295; 330/301
[58] Field of Search ...................... 330/84, 124 R, 255, 330/260, 275, 295, 301

[56] References Cited

U.S. PATENT DOCUMENTS 2,994,832 8/1961 James .................................. 330/255

Primary Examiner—James B. Mullins
Attorney, Agent, or Firm—Steven R. Biren

[57] ABSTRACT

An input signal (Vin) is applied to a first amplifier (A1) and a second amplifier (A2) via a circuit (M), which amplifiers are both coupled to an output terminal (U) to supply an output voltage (Vuit). For this purpose the circuit (M) generates two mutually complementary signals which are related to the output signal (Vuit) and the maximum signal values corresponding to the individual output signals of the first amplifier (A1) and the second amplifier (A2). The output signal to be supplied (Vuit) consequently dictates which amplifier (A1, A2) is driven into full conduction.

9 Claims, 3 Drawing Sheets

MULTIPLE-AMPLIFIER CONTROL ARRANGEMENT

BACKGROUND OF THE INVENTION

The invention relates to an amplifier arrangement comprising a first amplifier having a first transistor for producing on an output a first output voltage to a maximum first voltage value, which first amplifier is coupled between a first and a second supply voltage terminal.

Such an amplifier arrangement can be used for amplifying a signal in electronic circuits, such as integrated audio amplifier circuits.

An amplifier arrangement of this type is known inter alia from the second edition of the book "Analysis and Design of Analog Integrated Circuits" by P. Gray and R. Meyer. In FIG. 3.8a on page 175 this book shows a transistor having a control electrode and two main electrodes, an input signal being applied to the control electrode and the supply voltage terminals being coupled to the main electrodes. The output voltage is taken from one of the main electrodes, which is coupled to the associated supply-voltage terminal by means of a resistor. A drawback of such an amplifier arrangement is that in the case of integration the maximum output voltage of the transistor is dictated by the fabrication process. If this maximum voltage value is exceeded this will be disastrous to the amplifier. Therefore, the output voltage of the amplifier is limited to the maximum voltage value. Generally, the voltage difference between the two supply-voltage terminals is selected to be smaller than said maximum voltage value, so that the output voltage cannot cause damage to the amplifier. However, if the voltage difference is selected to be larger than the maximum voltage value, the fabrication process will impose limitations on the output voltage of the amplifier arrangement.

SUMMARY OF THE INVENTION

It is an object of the invention to provide an amplifier arrangement which is capable of supplying an output voltage larger than the maximum voltage value imposed on the output voltage of the amplifier by the fabrication process, the voltage difference between the two supply-voltage terminals being chosen so as to enable a larger output voltage to be obtained.

An amplifier arrangement in accordance with the invention is characterized in that the amplifier arrangement further comprises a second amplifier having a second and a third transistor, coupled serially, for producing on the output a second output voltage up to a maximum second voltage value, which second amplifier is also coupled between the first and the second supply voltage terminal, and means for driving the first and the second amplifier with a first and a second signal respectively, the sum of the first and the second signal being substantially proportional to an input signal and the ratio between the first and the second signal being related mainly to the output voltage with respect to the first voltage value.

The invention is based on the recognition of the fact that the amplification of the input signal is taken over by the second amplifier when the resulting output voltage tends to exceed the maximum voltage value of the first amplifier. The means ensure a gradual crossover between the first and the second amplifier. The first amplifier is adapted to supply comparatively small output voltages at large currents and the second amplifier is adapted to supply comparatively small output currents at large voltages. For this purpose, the second amplifier comprises two serially coupled transistors, which together can generate the comparatively large output voltages at small currents. The amplifier arrangement can therefore supply a maximum output voltage which is related to the voltage difference between the two supply-voltage terminals.

An embodiment of an amplifier arrangement in accordance with the invention may be characterized in that the means comprise a differential pair comprising a fourth and a fifth transistor each having a control electrode for receiving a first measure of the output voltages and a first reference voltage respectively, having mutually coupled first main electrodes for receiving a measure of the input signal, and each having a second main electrode for driving the first amplifier and the second amplifier respectively. The differential pair compares a fraction of the output voltages with the first reference voltage, which comparison results in two complementary representations of the input signal, i.e. the first and the second signal respectively. The first reference voltage then dictates the instant of take-over.

A further embodiment of an amplifier arrangement in accordance with the invention may be characterized in that the means further comprise a current regulator. The current regulator serves to minimize the cross-over distortion of the signals. This is achieved by maintaining the bias currents of the first and the second amplifier constant when these amplifiers are operative. For this purpose the current regulator will extract currents from the first main electrodes of the first and the second transistor, which currents are inversely proportional to the degree of conduction of said transistors.

Yet another embodiment of an amplifier arrangement in accordance with the invention may be characterized in that the second and the third transistor each have a control electrode, which control electrodes are coupled respectively to the means and to a terminal for receiving a third measure of the output voltages. One transistor receives its drive via the means and the other transistor receives its drive from the output voltages. Cascoding allows a higher voltage to be obtained across the two transistors, so that a larger output signal is possible. In this case the single transistor in the first amplifier, as is illustrated in the above example, will supply low voltages at large currents and the cascoded transistors in the second amplifier will supply high voltages at small currents.

BRIEF DESCRIPTION OF THE DRAWINGS

The invention will now be described in more detail, by way of example, with reference to the accompanying drawing, in which.

In the Figures like parts bear the same reference numerals.

DESCRIPTION OF THE PREFERRED EMBODIMENTS

Figure 1:
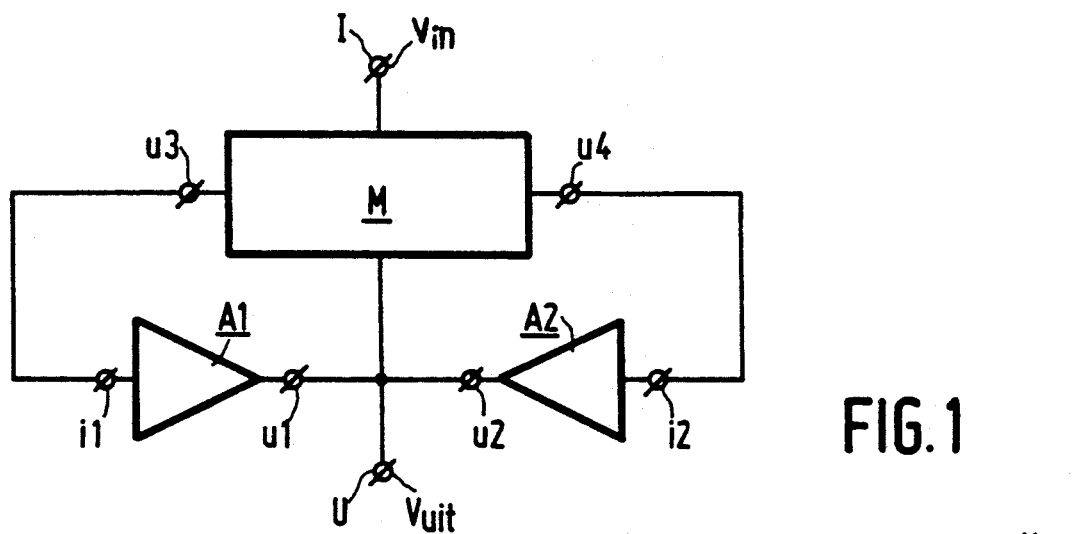
FIG. 1 is a basic diagram of an amplifier arrangement in accordance with the invention.

FIG. 1 is a basic diagram of an amplifier arrangement in accordance with the invention. The arrangement has an input terminal I for receiving an input signal Vin and an output terminal U for supplying an output signal Vuit, a first amplifier A1 having an input terminal i1 and an output terminal u1, a second amplifier A2 having an input terminal i2 and an output terminal u2, and means M having an output terminal u3 and an output terminal u4. The amplifier A1 is constructed to amplify the input signal Vin up to a maximum first voltage value and the amplifier A2 up to a maximum second voltage value. The means M are coupled to the input terminal I and to the output terminal U, to which in addition the output terminals u1 and u2 are connected. The output terminals u3 and u4 are coupled to the input terminals i1 and i2 respectively. The means M generate a first signal on the output terminal u3 and a second signal on the output terminal u4, which signals are complementary to one another and serve to drive the amplifier A1 and the amplifier A2 respectively. The signals are measures of the input signal Vin and, in addition, they depend upon the output signal Vuit in relation to the maximum voltage values of the output signals of amplifiers A1 and A2. These output signals together constitute the output signal Vuit. The means M receive an input signal Vin which results in an output signal Vuit smaller than the first maximum voltage value to the amplifier A1 as the first signal. The amplifier A2 then receives no drive, so that the second signal is zero. Consequently, the output signal is constituted by the output signal of the amplifier A1. As the input signal Vin increases and the output signal Vuit consequently tends to exceed the first maximum voltage value the drive to the amplifier A1 will decrease and that to the amplifier A2 will increase. The output signals of the two amplifiers A1 and A2 now form the output signal Vuit. As the input signal Vin increases further the drive to the amplifier A1, i.e. the first signal, will have become zero before the output signal Vuit exceeds the first maximum voltage value. The means M then generate only the second signal, which drives the amplifier A2. Consequently, the output signal Vuit is formed by the output signal of the amplifier A2. When the second maximum voltage value associated with the amplifier A2 is larger than the supply voltage difference this will ensure that the amplifier cannot be damaged.

Figure 2:
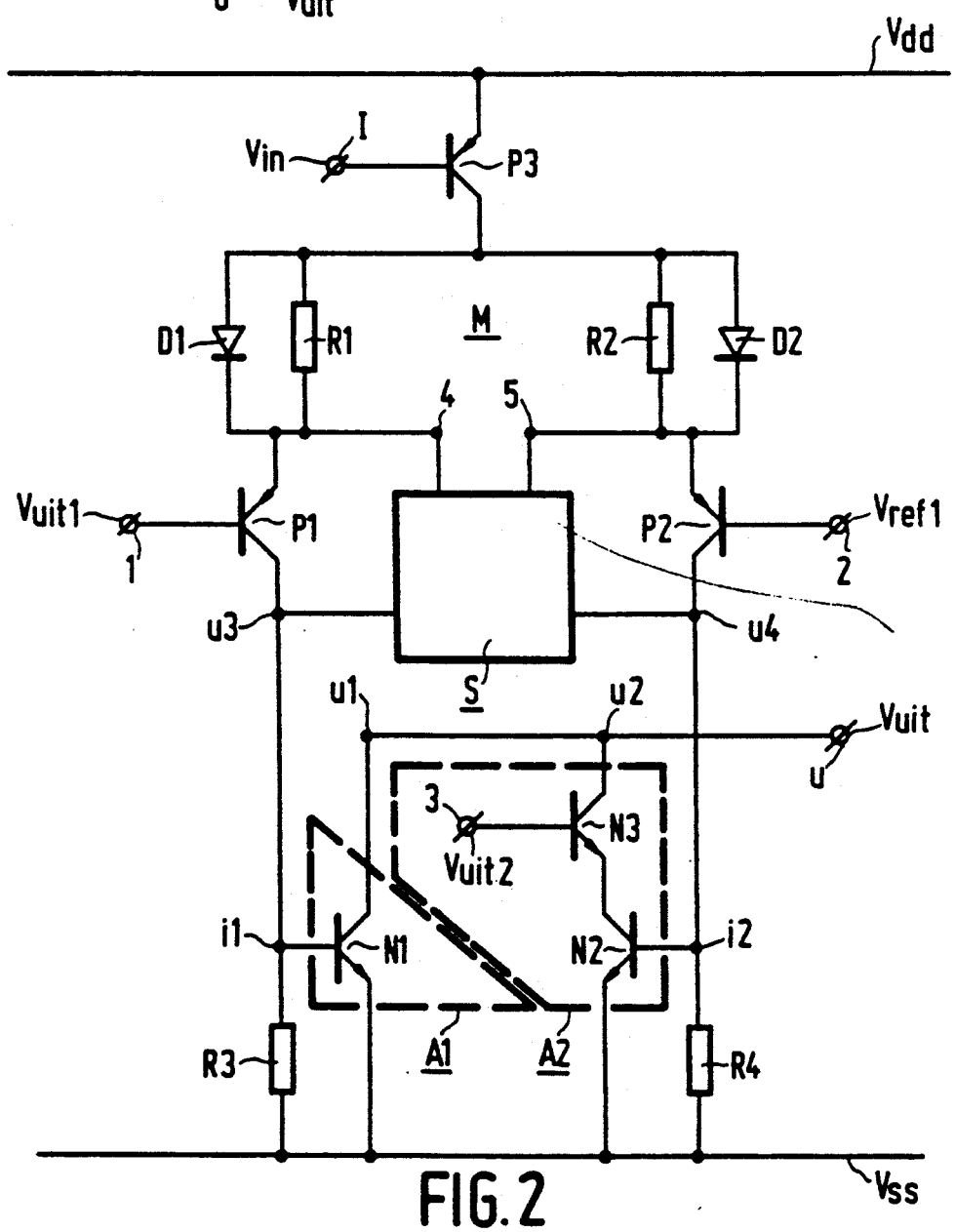
FIG. 2 shows a first embodiment of an amplifier arrangement in accordance with the invention.

FIG. 2 shows a first embodiment of an amplifier arrangement in accordance with the invention. The first amplifier A1 comprises a transistor N1 having its control electrode coupled to the input terminal i1, having its first main electrode coupled to a supply-voltage terminal Vss, and having its second main electrode coupled to the output terminal u1. The second amplifier A2 comprises a transistor N2 having its control electrode coupled to the input terminal i2 and having its first main electrode coupled to the supply-voltage terminal Vss, and a transistor N3 having its control electrode coupled to a terminal 3 to receive a measure Vuit2 of the output voltage Vuit, having its first main electrode coupled to the main electrode of the transistor N2 and having its second main electrode coupled to the output terminal u2. The other elements constitute the means M, which are coupled to the two amplifiers A1 and A2 in a way similar to that shown in FIG. 1. A transistor P1 and a transistor P2, which form part of the means M, constitute a degenerate differential pair, for which purpose they have their first main electrodes coupled to a terminal 4 and a terminal 5 respectively, which terminals are coupled to each other by a parallel arrangement of a diode D1 and a resistor R1 in series with another parallel arrangement of a diode D2 and a resistor R2. The node common to the two parallel arrangements is coupled to the second main electrode of a transistor P3, whose first main electrode is coupled to a supply-voltage terminal Vdd and whose control electrode is coupled to the input terminal I. Moreover, the transistor P1 has its control electrode coupled to a terminal 1 to receive a measure Vuit1 of the output voltage Vuit and has its second main electrode, which is also connected to the supply-voltage terminal Vss by a resistor R3. The transistor P2 further has its control electrode coupled to a terminal 2 to receive a reference voltage Vref1 and has its second main electrode coupled to the output terminal u4, which is also connected to the supply-voltage terminal Vss by a resistor R4. The means M further comprise a current regulator S, which is coupled to the terminals 4 and 5 and to the output terminals u3 and u4. The function of this regulator S is to maintain the bias currents and hence the transconductances of the amplifiers A1 and A2 constant when these are operative. This precludes unnecessary cross-over distortion. The resistors R1 and R2 provide a gradual cross-over between the transistors P1 and P2, the diodes D1 and D2 limiting the voltage drops across these resistors. The resistors R3 and R4 limit the control-electrode currents of the transistors N1 and N2. The circuit is driven by the input signal Vin applied to the input terminal I. This input signal Vin is transferred to the differential pair P1 and P2 via the transistor P3. The magnitude of the measure Vuit1 of the output signal Vuit in relation to the reference voltage Vref1 dictates the degree of conduction of the transistors P1 and P2. In the case of an input signal Vin resulting in a measure Vuit1 of the output signal Vuit, which relative to the supply-voltage terminal Vss is smaller than the reference voltage Vref1, the transistor P1 will conduct and the transistor P2 will be cut off. How the measure Vuit1 can be obtained will be described with reference to FIG. 4. On the basis of the fabrication process the reference voltage Vref1 is selected in such a way that the output signal of the first amplifier does not exceed the first voltage value and the output signal of the second amplifier does not exceed the second voltage value. The input signal Vin will then produce the first signal on the output terminal u3 via the transistor P3, the diode D1, the resistor R1 and the transistor P1. This signal drives the amplifier A1 via the control electrode of the transistor N1. The second amplifier A2 does not receive any drive via the control electrode of the transistor N2, so that this transistor is not conductive. Consequently, the transistors N3 will not be conductive, although this transistor is driven by the measure Vuit2 of the output signal Vuit via its control electrode, which measure is obtained, for example, by means of a voltage divider. As the input signal Vin increases and the measure Vuit1 tends to become equal to the reference voltage Vref1, the transistor P2 will be driven into conduction and the transistor P1 will become less conductive. The second signal on the output terminal u4 will then also increase, causing the second amplifier to be driven via the control electrode of the transistor N2. In this situation the current regulator S ensures that both amplifiers have equal bias currents. As the input signal Vin increases further the transistor P1 will be cut off, while the transistor P2 will be fully conductive. Consequently, the transistor N1 will no longer receive any drive, so that the currents in this transistor will be zero. In constrast, the transistors N1 and N3 are now both conductive. The transistor N2 is then driven by the second signal, which is derived from the input signal Vin via the transistor P2, the diode D2, the resistor R2 and the transistor P3. The transistor N3 is still driven by the measure Vuit2 of the output signal Vuit and is now turned on because the transistor N2 conducts. The operation of this arrangement will become apparent from the description of the following versions of the two amplifiers. The amplifier A1 comprises a transistor N1, which is capable of supplying comparatively large output currents at low voltages and which has a maximum voltage value dictated by the selected fabrication process. The amplifier A2 comprises a cascode pair comprising a transistor N2 and a transistor N3, which together are capable of supplying comparatively high output voltages at small currents. The two amplifiers supplement one another in such a way that the entire amplifier arrangement has a larger output swing than the individual amplifiers.

Figure 3:
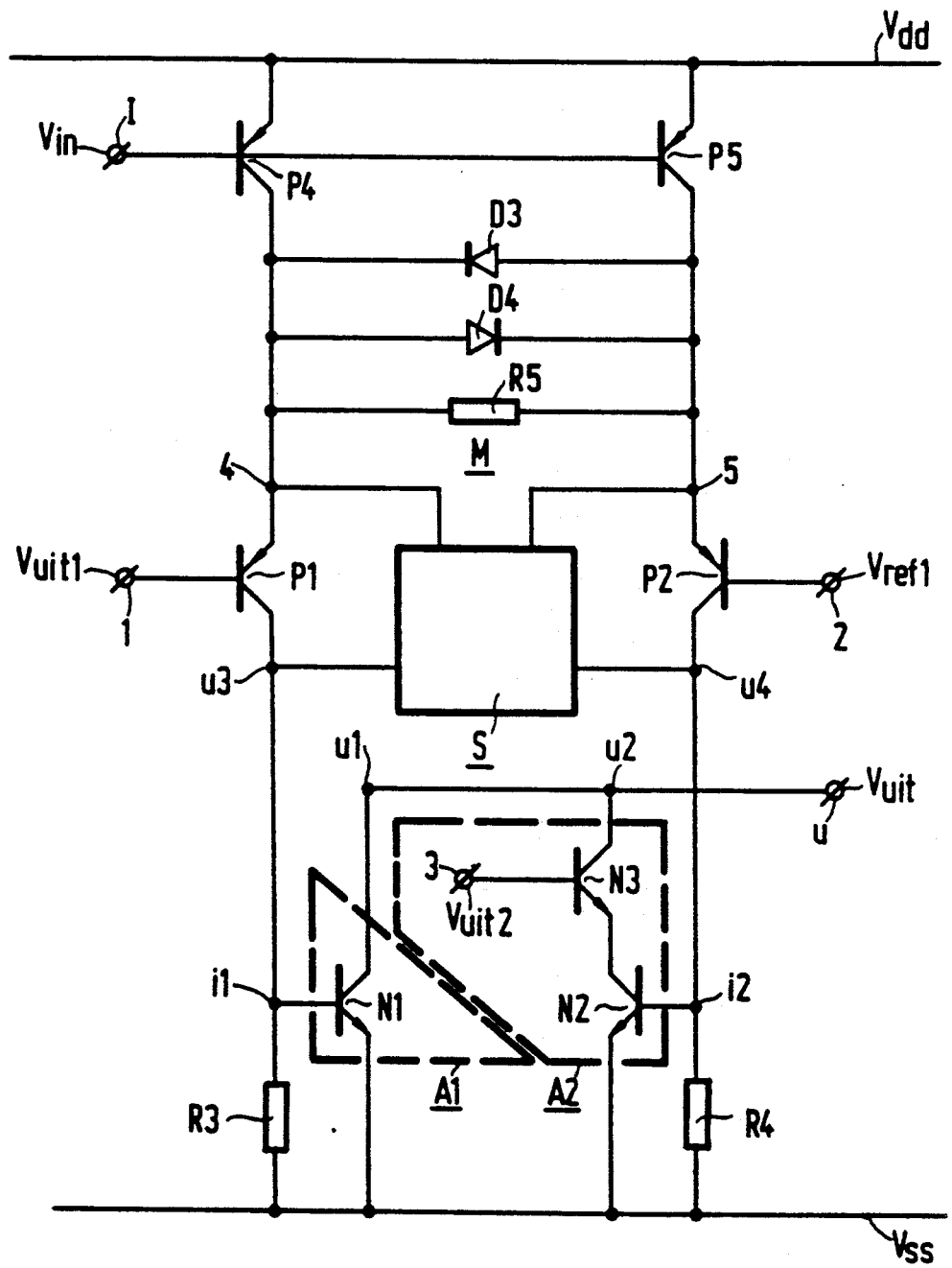
FIG. 3 shows a second embodiment of an amplifier arrangement in accordance with the invention.

FIG. 3 shows a second embodiment of an amplifier arrangement in accordance with the invention. This arrangement is largely identical to the arrangement shown in FIG. 2, i.e. the diodes D1 and D2, the resistors R1 and R2 and the transistor P3 have been replaced. The terminals 4 and 5 are now coupled to one another by a parallel arrangement of a diode D3, a diode D4 and a resistor R5. Moreover, two transistors P4 and P5 have been added whose control electrodes are coupled to the input terminal I, whose first main electrodes are coupled to the supply-voltage terminal Vdd and whose second main electrodes are coupled to the terminals 4 and 5 respectively. This embodiment, which enables an integrable resistor to be dispensed with, operates in a way equivalent to that of the arrangement described with reference to FIG. 2. The input signal Vin drives the transistors P4 and P5, which activate the degenerate differential pair P1 and P2 by means of the resistor R5. The diodes D3 and D4 again serve to limit the voltage across the resistor R5.

Figure 4:
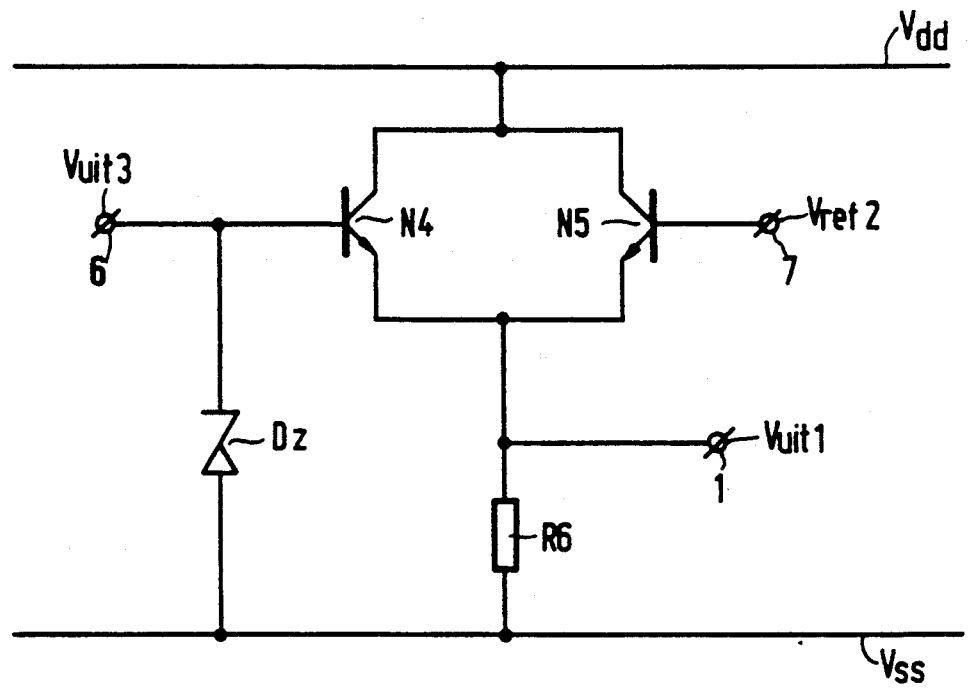
FIG. 4 shows an extension of the above embodiments of an amplifier arrangement in accordance with the invention.

FIG. 4 shows an extension of the above embodiments of an amplifier arrangement in accordance with the invention. A transistor N4 and a transistor N5 are arranged in parallel, their first main electrodes being coupled both to the supply-voltage terminal Vss by a resistor R6 and to the terminal 1 and their second main electrodes being connected to the supply-voltage terminal Vdd. The control elctrode of the transistor N4 is coupled both to a terminal 6 for receiving a measure Vuit3 of the output voltage Vuit and to the supply voltage Vss by means of a zener diode Dz. The measure Vuit3 can be obtained by means of a voltage divider. The control electrode of the transistor N5 is connected to a terminal 7 for a reference voltage Vref2. This arrangement limits the measure Vuit1 of the output signal Vuit to substantially the reference voltage Vref2 in order to keep the transistor P1 out of saturation for the purpose of driving the amplifier A1. Moreover, the measure Vuit3 of the output voltage Vuit is limited by the zener diode Dz in order to prevent the occurrence of excessively large signals.

Figure 5:
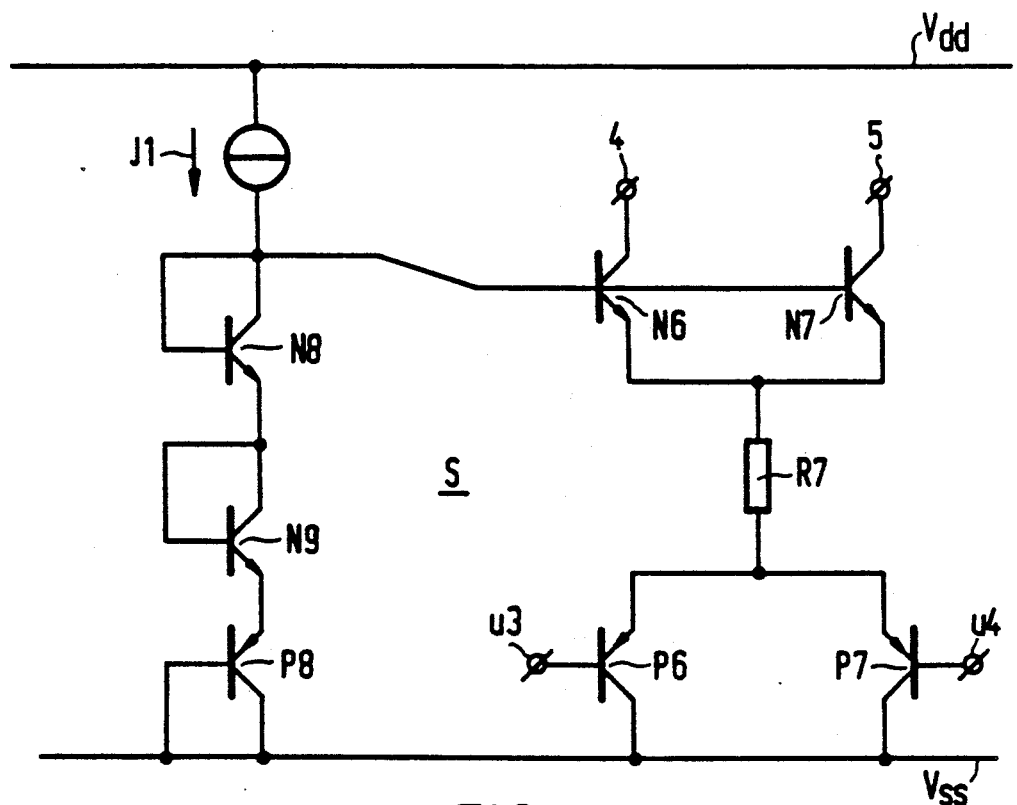
FIG. 5 shows an example of a current regulator for an amplifier arrangement in accordance to the invention.

FIG. 5 shows an example of a current regulator for an amplifier arrangement in accordance with the invention. A transistor N6 and a transistor N7 are coupled to each other via their first main electrodes and their control electrodes, which control electrodes are also coupled to a reference-voltage circuit. The second main electrodes of the transistors N6 and N7 are coupled to the terminals 4 and 5 respectively. A transistor P6 and a transistor P7 constitute a differential pair, the first main electrodes being coupled to each other and being connected to the first main electrodes of the transistors N6 and N7 by a resistor R7, the second main electrodes being coupled to the supply-voltage terminal Vss, and the control electrodes being coupled to the output terminals u3 and u4 respectively. The reference-voltage circuit is coupled between the supply voltages Vdd and Vss and comprises a series arrangement of a current source J1 and three diode-connected transistors N8, N9 and P8 respectively. The transistor N8 has its control electrode and its second main electrode coupled to both the current source J1 and the control electrodes of the transistors N6 and N7, and has its first main electrode coupled to the control electrode and the second main electrode of the transistor N9, whose first main electrode is connected to the first main electrode of the transistor P8. The reference-voltage circuit provides the bias voltage for the transistors N6 and N7, the differential pair P6 and P7 dictating the magnitude of the currents depending on the voltages on the output terminals u3 and u4. These currents ensure that the bias currents applied to the active amplifier of the amplifiers A1 and A2 constantly have substantially constant values to stabilize the corresponding transconductances. This minimizes the cross-over distortion. Equal voltages on the output terminals u3 and u4 will give rise to equal currents through the transistors N6 and P6 and through the transistors N7 and P7. Unequal voltages on the output terminals u3 and u4, however, will give rise to unequal currents through the transistors P6 and P7, while the currents through the transistors N6 and N7 remain equal to each other. The magnitudes of the currents are dictated by the voltage difference between the control electrodes of the transistors N6 and N7 on the one hand and the output terminals u3 and u4 on the other hand.

The invention is not limited to the embodiments disclosed herein. Within the scope of the invention several modifications are conceivable to those skilled in the art. For example, the two amplifiers can be constructed in several ways depending on the selected fabrication process and the required specifications. It is also possible to use unipolar transistors and to use a different construction for the means, including the current regulator.

We claim:

1. An amplifier arrangement comprising a first output amplifier having only a first transistor for producing on an output a first output voltage of up to a maximum first voltage value, which first amplifier is coupled between a first and a second supply voltage terminal, and a second output amplifier having a second and a third transistor, coupled serially, for producing on the output a second output voltage of up to a maximum second voltage value larger than said first voltage value, said second amplifier also being coupled between the first and the second supply voltage terminal, and means for driving the first and the second amplifier with a first and a second signal, respectively, the sum of the first and the second signal being substantially proportional to an input signal, and the ratio between the first and the second signal being substantially a function of the output voltage with respect to the first voltage value.

2. An amplifier arrangement as claimed in claim 1, characterized in that the means comprises a differential pair comprising a fourth and a fifth transistor each having a control electrode for receiving a first measure of the output voltages and a first reference voltage, respectively, each having mutually-coupled first main electrodes for receiving a measure of the input signal, and each having a second main electrode for driving the first amplifier and the second amplifier, respectively.

3. An amplifier arrangement as claimed in claim 2, characterized in that the means further comprises a further differential pair comprising a sixth and a seventh transistor, each having a control electrode for receiving a second measure of the output voltages and a second reference voltage, respectively, and having their first main electrodes coupled to one another to supply the first measure of the output voltages.

4. An amplifier arrangement as claimed in claim 2, characterized in that the means further comprises a current regulator.

5. An amplifier arrangement as claimed in claim 4, characterized in that the current regulator is at least coupled to the main electrodes of both the fourth and the fifth transistor.

6. An amplifier arrangement as claimed in claim 5, characterized in that the current regulator comprises a differential pair whose first main electrodes are coupled to each other and to a reference-voltage circuit.

7. An amplifier arrangement as claimed in claim 4, characterized in that the current regulator comprises a differential pair whose first main electrodes are coupled to each other and to a reference-voltage circuit.

8. An amplifier arrangement as claimed in claim 1, characterized in that the second and the third transistor each have a control electrode, which control electrodes are coupled, respectively, to the means and to a terminal for receiving a third measure of the output voltages.

9. An amplifier arrangement as claimed in claim 1, characterized in that the means further comprise a current regulator.

* * * * *